United States Patent
Matsuo (10) Patent No.: US 7,633,355 B2
(45) Date of Patent: Dec. 15, 2009

(54) VARIABLE MATCHING CIRCUIT

(75) Inventor: Michiaki Matsuo, Tokyo (JP)

(73) Assignee: Panasonic Corporation, Osaka (JP)

( * ) Notice: Subject to any disclaimer, the term of this patent is extended or adjusted under 35 U.S.C. 154(b) by 416 days.

(21) Appl. No.: 11/568,188

(22) PCT Filed: Apr. 19, 2005

(86) PCT No.: PCT/JP2005/007446

§ 371 (c)(1),
(2), (4) Date: Oct. 23, 2006

(87) PCT Pub. No.: WO2005/104362

PCT Pub. Date: Nov. 3, 2005

(65) Prior Publication Data

US 2008/0238569 A1    Oct. 2, 2008

(30) Foreign Application Priority Data

Apr. 22, 2004 (JP) ............................. 2004-126633

(51) Int. Cl.
*H03H 7/38* (2006.01)
(52) U.S. Cl. ....................................... 333/32; 333/17.3
(58) Field of Classification Search ................. 333/32, 333/17.3, 81 R, 124, 129, 132, 167, 174, 333/175, 176

See application file for complete search history.

(56) References Cited

FOREIGN PATENT DOCUMENTS

| JP | 60-010907 A | 1/1985 |
|---|---|---|
| JP | 02-220509 A | 9/1990 |
| JP | 10-163772 A | 6/1998 |
| JP | 10-242849 A | 9/1998 |
| JP | 11-088080 A | 3/1999 |
| JP | 11-122013 A | 4/1999 |
| JP | 2001-186042 A | 7/2001 |
| JP | 2001-196854 A | 7/2001 |
| JP | 2002-009573 A | 1/2002 |
| JP | 2002-208871 A | 7/2002 |

OTHER PUBLICATIONS

International Search Report for Application No. PCT/JP2005/007446, dated Aug. 2, 2005.

*Primary Examiner*—Stephen E Jones
(74) *Attorney, Agent, or Firm*—RatnerPrestia (57) ABSTRACT

A variable matching circuit includes a variable capacitance circuit formed of a capacitor coupled to varactor diode and provided between terminals, and a resonator-type circuit includes a plurality of inductors and a variable capacitance circuit formed of a capacitor and a varactor diode. The inductors and the variable capacitance circuit are coupled in parallel together. The resonator-type circuit is connected in shunt with the terminal. The foregoing structure forms an L-type matching circuit. The bias of the varactor diodes can be thus varied, and plural values of the inductance of the resonator-type circuit can be switched over with a FET. The variable matching circuit can electrically control an impedance conversion available for wider ranges of frequency bandwidths.

3 Claims, 9 Drawing Sheets

| | C:1~6pF | |
|---|---|---|
| | L:1nH | L:6nH |
| 900MHz | Area A | Area B |
| 2GHz | Area C | Area D |

|  | C:1~6pF | |
|---|---|---|
|  | L:1nH | L:6nH |
| 900MHz | Area E | Area F |
| 2GHz | Area G | Area H |

VARIABLE MATCHING CIRCUIT

THIS APPLICATION IS A U.S. NATIONAL PHASE APPLICATION OF PCT INTERNATIONAL APPLICATION PCT/JP2005/007446.

TECHNICAL FIELD

The present invention relates to matching circuits electrically controllable over an impedance conversion, which matching circuits are employed in radio devices using a plurality of radio frequency bands higher than or equal to UHF band.

BACKGROUND ART

Recently, personal wireless systems such as a data communication system, used by a portable telephone called a cellular phone, and a wireless LAN built by a personal computer, have been widely used. Reception of digital television broadcasting on the ground wave with a portable personal wireless terminal has been studied in progress. Infrastructure of various wireless systems has been built as discussed above. Amid the foregoing circumstances, personal information terminals including typically a cellular phone are required to make plural and yet different wireless systems available within one information terminal for users' convenience. On the other hand, a cellular system provides a service employing a wider radio frequency bandwidth, e.g. GSM method uses multi-band such as employing additionally 1.8 GHz band, 1.9 GHz band besides the basic bands of 850 MHz band, 900 MHz band. These additional bands are almost twice of the basic ones. The GSM method also uses 450 MHz band which is almost a half of the basic bands. In recent years, another new technique called "software radio" has been studied, i.e. the characteristics of radio device such as frequency, transmission power, and mode of radio wave can be changed with software.

What is necessary for the information terminal to adapt itself to the wireless system, which uses different wireless networks or multi-bands, is to have a radio device that can process signals of wider frequency bands ranging from UHF band to microwave-band. However, an appropriate signal process, such as amplification, selection, and frequency conversion of a high frequency signal of radio frequency, needs a well matching between the elements of a circuit, otherwise the radio device cannot fully exert its performance. To overcome this problem, a conventional technique has generally prepared a plurality of signal processing systems which optimize circuit constants appropriate to the radio frequency bands to be used, and switches over a signal processing system to a proper one when a radio frequency to be used is heavily changed. For instance, Unexamined Japanese Patent Publication No. 2001-186042 discloses a radio device employing GSM method, and this radio device aims to use three radio frequency bands, namely, 900 MHz band, 1.8 GHz band, and 450 MHz band. This conventional radio device has processing systems in parallel for selecting and amplifying the signals of the foregoing three frequency bands.

Figure 9:
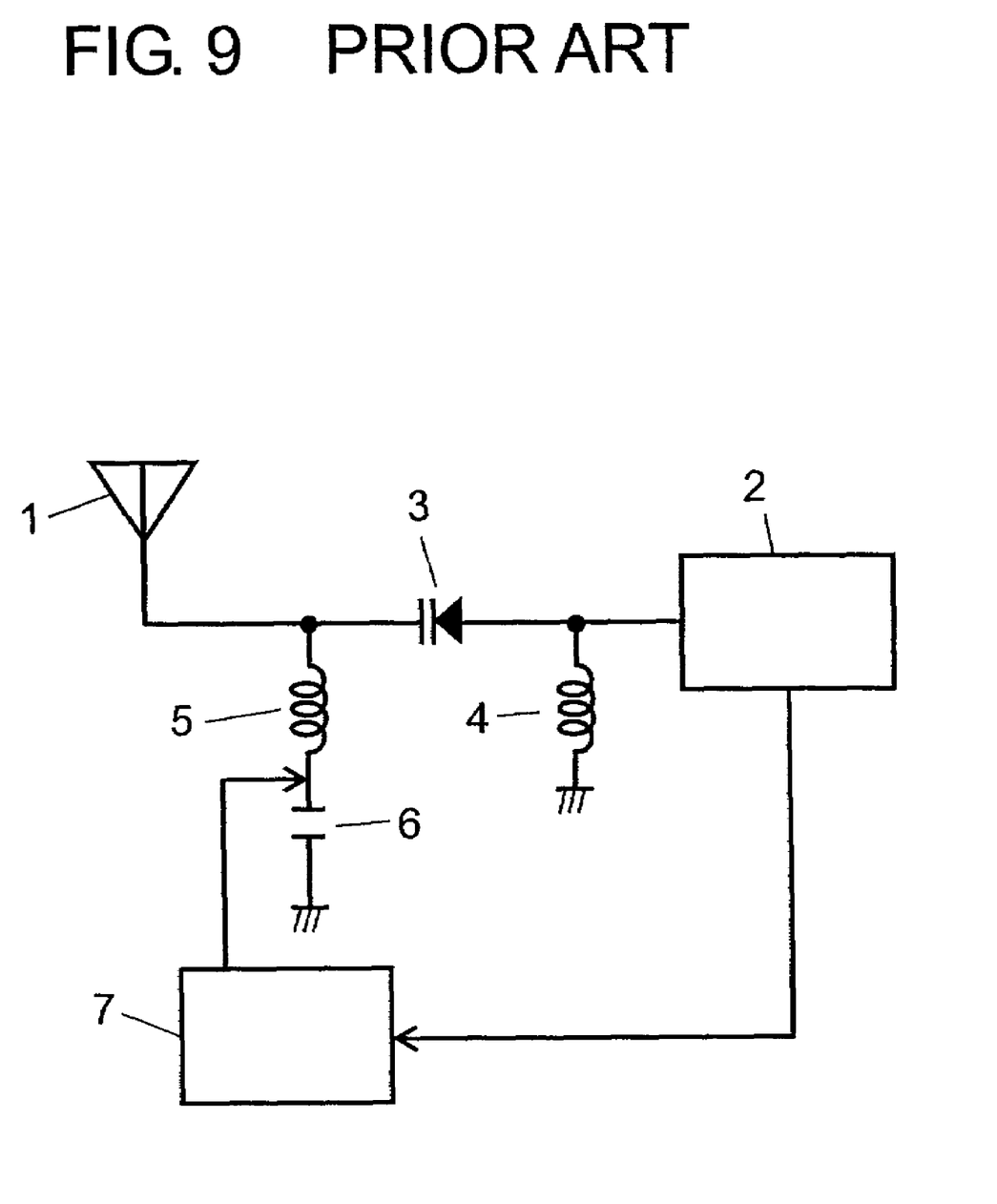
FIG. 9 shows a structure of a conventional variable matching circuit.

Another radio device is disclosed in Unexamined Japanese Patent Publication No. 2002-208871, and this one proposes to process radio frequency signals of plural frequency-bands with only one processing system. FIG. 9 shows a structure similar to this radio device. In FIG. 9, matching between antenna 1 and transmit/receive circuit 2 is done by fixed inductor 4 and variable capacitor 3. Choke-coil 5, capacitance 6 and voltage generating circuit 7 form a bias circuit which varies the capacitances of variable capacitor 3 without affecting radio frequency signals. This conventional radio device aims to use both of 800 MHz band and 1.5 GHz band, and the matching in the foregoing two bands is done through varying the capacitance of variable capacitor 3.

In the case of building a radio device applicable to different wireless network systems or wireless systems of multi-bands, the radio device disclosed in Unexamined Japanese Patent Publication No. 2001-186042 needs a plurality of signal processing systems in response to frequency bandwidths. The number of signal processing systems to be mounted in parallel thus increases at a greater number of radio frequency bandwidths to be used. The radio section thus requires a wider space for mounting in the radio device, and a chip area for integrating the functions into a semiconductor increases, which results in an expensive cost.

The radio device disclosed Unexamined Japanese Patent Publication No. 2002-208871 has a variable reactance element formed of only a varactor diode, so that the impedance has a limit to its variable range. It is thus difficult for the radio device to adapt itself to a wide range of frequency bandwidths.

DISCLOSURE OF INVENTION

A variable matching circuit of the present invention is employed in a radio device adaptable to wireless systems handling different types of wireless networks and multi-bands. This variable matching circuit carries out an appropriate impedance matching at its high frequency radio section which processes the signals in wide frequency bandwidths ranging from UHF band to microwave-band.

The variable matching circuit of the present invention thus comprises the following elements:

a resonator-type circuit including an inductance circuit formed of a plurality of inductors, and a first capacitance circuit, of which element value is variable, coupled in parallel to the inductance circuit; and a second capacitance circuit of which element value is variable.

The matching circuit has a first terminal and a second terminal, either one of which terminals work as an input or an output, and the second capacitance circuit is coupled between the first terminal and the second terminal. The resonator-type circuit is coupled between the first terminal and the grounding. An inductance value of the inductance circuit can be switched with a combination of plural inductors and a switch into a plural values, thereby controlling the matching circuit.

The matching circuit is formed of a distributed constant line coupled in series to the second capacitance circuit and the resonator-type circuit.

The foregoing structure allows an L-shaped or π-shaped matching circuit to vary a capacitance value in the reactance circuit coupled in series as well as an inductance value in the reactance circuit coupled in shunt, so that a variable matching circuit highly adjustable in a wide range of frequency bandwidths is obtainable.

In the case where an impedance cannot converted into a desirable one due to the influence of self resonance of a variable reactance element at a high frequency band, the built-in distributed constant line works its impedance conversion function for carrying out the desirable impedance conversion.

DESCRIPTION OF REFERENCE MARKS

10, 30 capacitor
11, 31, 32 varactor diode
20, 21, 22, 80 inductor
40, 41 FET
50, 51, 52, 53, 54, 55 resonator-type circuit
60, 61 distributed constant line
70, 71 terminal
81, 82, 83 resistance element
100, 101, 102, 110 variable matching circuit
200 impedance controller
300 antenna
400 low-noise amplifier

DETAILED DESCRIPTION OF PREFERRED EMBODIMENTS

Exemplary embodiments of the present invention are demonstrated hereinafter with reference to the accompanying drawings.

Embodiment 1

Figure 1:
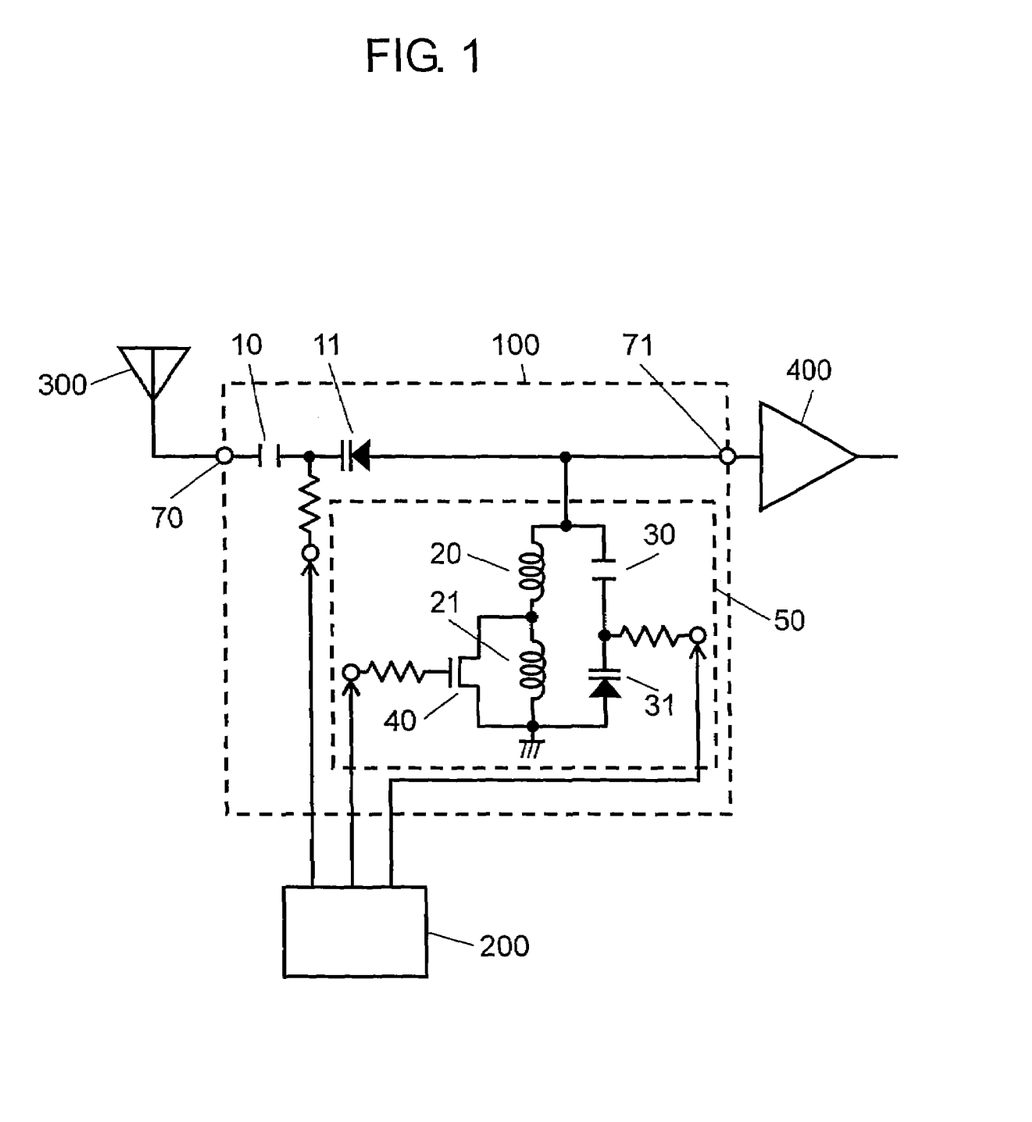
FIG. 1 shows a structure of a variable matching circuit in accordance with a first embodiment of the present invention.

FIG. 1 shows a structure of a variable matching circuit in accordance with the first embodiment. In FIG. 1, terminals 70 and 71 work as input/output terminals of variable matching circuit 100. Capacitor 10 and varactor diode 11 form a capacitance circuit having a variable capacitance coupled between the foregoing two terminals, and this capacitance circuit forms a second capacitance circuit of the present invention. Resonator-type circuit 50 is grounded via terminal 71, and includes a capacitance circuit formed of capacitor 30 and varactor diode 31, which capacitance circuit corresponds to a first capacitance circuit of the present invention, and an inductance circuit formed of two inductors 20, 21 coupled in series. The capacitance circuit is coupled in parallel to the inductance circuit. Inductors 20, 21 are grounded via FET (field effect transistor) 40. External elements are coupled to variable matching circuit 100 such as varactor diodes 11, 31 and impedance controller 200 which controls the bias voltage of FET 40, antenna 300 of the radio device, and low-noise amplifier 400 of the receiving system. Resistance elements 81, 82, and 83 work as bias resistors for coupling impedance controller 200 to varactor diodes 11, 31 and FET 40. A choke inductor can be used instead of these bias resistors.

FIG. 1 shows parts of a receiver front-end including variable matching circuit 100 in accordance with the first embodiment. The receiver front-end of a radio device amplifies a radio frequency signal received by antenna 300 at low-noise amplifier 400. In general, an impedance converting circuit is involved in matching the impedance of an antenna with the input impedance of an amplifier so that a high frequency signal can be transmitted efficiently. The input/output impedance of the high frequency circuit employed in the radio device is set, in general, at 50Ω when the device is designed. The impedance of antenna 300 is thus set at 50Ω by devising a place of the feeding point and the structure.

The amplifier is generally attached with a matching circuit at the input side of the amplifier. The matching circuit converts an input impedance of a transistor to become an amplifying element into 50Ω. Variable matching circuit 100 works as the foregoing matching circuit. Low-noise amplifier 400 has an impedance at a gain matching point where the maximum gain is obtained, and another impedance at a noise matching point where the minimum noise figure is obtained. Since this impedance differs from that one, it is necessary, under the condition that a reflected amount of an input signal becomes not greater than a given amount at 50Ω input impedance of the amplifier, to convert the impedance to the point where the noises become minimum. An accurate adjustment of the impedance is thus needed. Besides, since the optimum point of the impedance varies depending on the frequency to be used, a matching circuit formed of circuit elements having fixed values cannot adapt itself to a wide range of frequency bandwidths. The variable matching circuit is thus needed because it is electrically adjustable.

An operation of variable matching circuit 100 in accordance with this first embodiment is demonstrated hereinafter. Capacitor 10 and varactor diode 11, both of which are coupled between terminals 70 and 71, form a capacitance circuit, and its capacitance is electrically variable with a voltage control by impedance controller 200. The anode terminal of varactor diode 11 is grounded through a direct current via inductors 20, 21. Varactor diode 11 works such that its capacitance becomes smaller at a higher voltage of the cathode voltage. Capacitor 10 is used for cutting off a direct current as well as adjusting a variable width of the capacitance of the entire variable capacitance elements.

Resonator-type circuit 50 grounded from terminal 71 is structured as an parallel-resonant circuit which includes the inductor component formed of inductors 20 and 21 coupled in parallel to the capacitance component formed of capacitor 30 and varactor diode 31. Resonator-type circuit 50 works a grounding element having an inductive reactance value when the frequency is lower than an parallel-resonant frequency calculated from its inductance component and capacitance component, while it works also the grounding element having a capacitive reactance value when the frequency is higher than the parallel-resonant frequency. The value of the capacitance component can be varied sequentially by varactor diode 31, and the inductance component can be varied to two values with opening/closing of the switch of FET 40. Assume that element value of inductor 20 is L1, and that of inductor 21 is L2, then the inductance component becomes the sum of L1 and L2 when FET switch is open, and the inductance component becomes L1 when the switch is closed. The shorted and grounded point is thus varied by opening/closing of the switch, and the element value of the inductance circuit can be changed step by step. Resonator-type circuit 50 basically works in the area where a reactance becomes inductive, i.e. the area where an inductance value can be obtained.

Figure 2A:
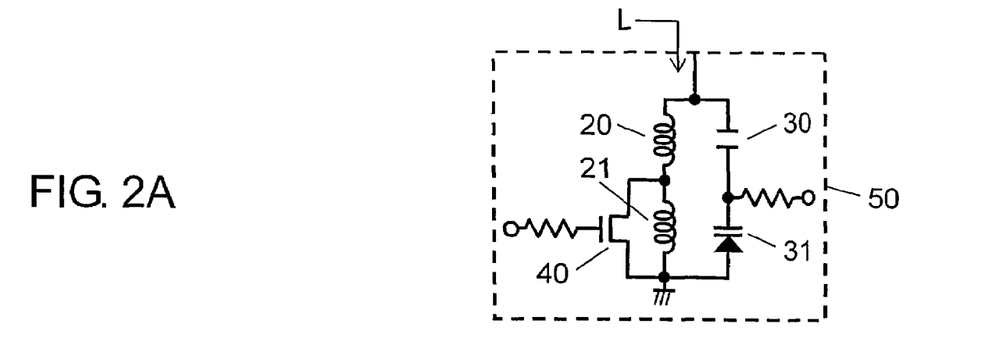
FIG. 2A shows a structure of resonator-type circuit 50 in the variable matching circuit in accordance with the first embodiment.
Figure 2B:
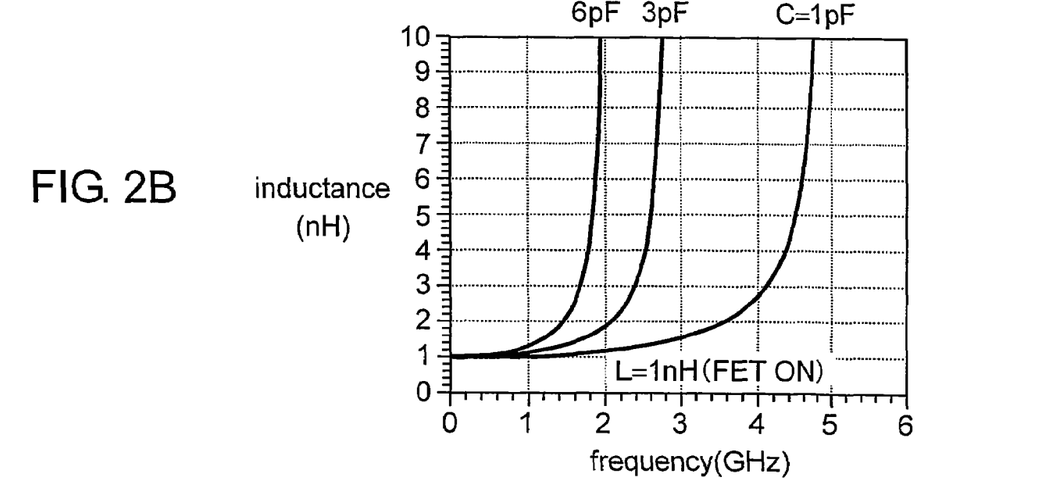
FIG. 2B shows frequency characteristics of an inductance value of the resonator-type circuit in accordance with the first embodiment.
Figure 2C:
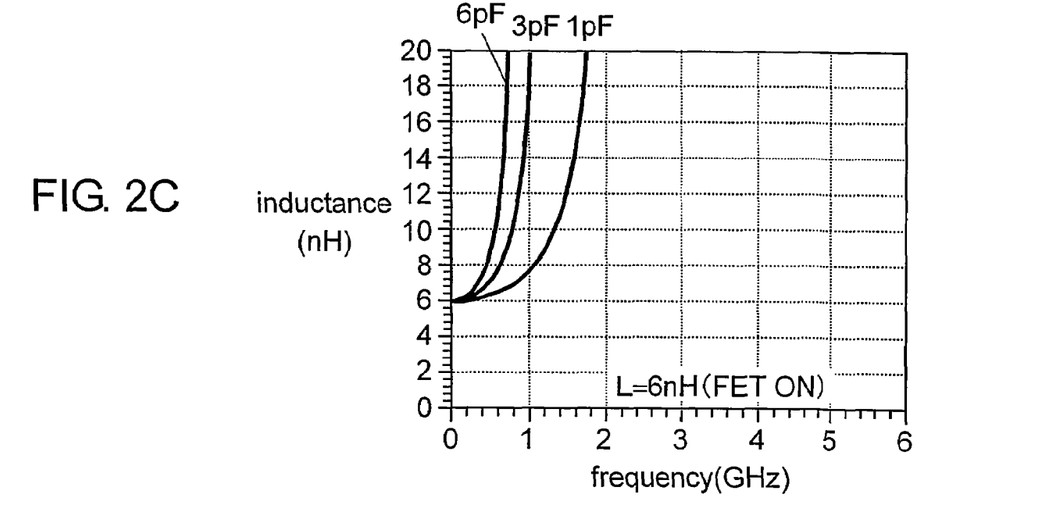
FIG. 2C shows frequency characteristics of an inductance value of the resonator-type circuit in accordance with the first embodiment.

FIG. 2 shows an analysis of the reactance of resonator-type circuit 50. FIG. 2A shows a structure of resonator-type circuit 50 shown in FIG. 1. The reactance is analyzed in this way: element value L1=1 nH, L2=5 nH, the capacitance component formed of varactor diode 31 and capacitor 30 varies from 1 pF to 6 pF. FIG. 2B shows the frequency characteristics of inductance value of resonator-type circuit 50 when FET 40 is closed and the inductance component takes a value of 1 nH. FIG. 2C shows the frequency characteristics when FET 40 is open and the inductance component takes a value of 6 nH, i.e. the sum of L1 and L2. When the inductance component shown in FIG. 2B is small, the parallel-resonant frequency becomes higher, so that resonator-type circuit 50 can be used as an inductive element up to a high frequency. When the inductance component shown in FIG. 2C is great, the parallel-resonant frequency becomes lower, so that circuit 50 can work only with limited frequencies of lower area. However, in this case, a high inductance value effective in the lower frequency range can be set with ease.

Varactor diode 31 and capacitor 30, which form a capacitance component in resonator-type circuit 50, works in order to vary an inductance value sequentially, however, they are not needed when the inductance value to be obtained is only discrete two values. This case is detailed hereinafter with reference to FIG. 2, assuming that a capacitance component takes a value of 6 pF. Since the inductance component takes a value of 1 nH which resonates in parallel around 2 GHz, the inductance component works inductively with the frequency range lower than 2 GHz, however, the inductance value sharply varies around the resonance frequency between 1 GHz and 2 GHz.

Varactor diode 31 changes its capacitance a little bit for varying the parallel-resonant frequency, then a steep slanted section of the characteristics curve moves, so that the inductance value viewed from a point between 1 GHz and 2 GHz is changed. For instance, viewed from the point of 1.5 GHz, the entire inductance value can be varied from 1 nH to 2 nH by changing the capacitance component from 1 pF to 6 pF. The variation occurs this way: a higher control voltage of varactor diode 31 for smaller capacitance varies a resonance frequency to a higher frequency band, so that the inductance value becomes lower, while the lower control voltage for greater capacitance varies the resonance frequency to a lower frequency band, so that the inductance value becomes higher.

A similar variation to the foregoing one can be expected when the inductance value shown in FIG. 2C is increased. When the capacitance component limits its capacitance change to a certain width, a structure of switching the inductance value significantly allows adjusting the inductance value in a wide range of frequency bands.

In the case of the instance shown in FIG. 2B, no changes in inductance can be expected in the frequency band not greater than 1 GHz; however, as shown in FIG. 2C, switch-over of the inductance value allows adjusting the inductance value in the band not greater than 1 GHz.

As discussed above, resonator-type circuit 50 can vary the inductance value through varying the capacitance of the varactor diode at the parallel-resonant frequency set slightly higher than the frequency in use, so that circuit 50 works as a reactance element which can vary the inductance value.

FET switch 40 has a switching function for switching over the inductance component. Since a relatively large inductance value becomes effective at a low frequency rather than a high frequency, this switching function allows setting an inductance value at an appropriate one whichever the frequency is high or low. As discussed above, FET switch 40 also can vary the inductance value in a wide range of frequencies. In resonator-type circuit 50, the inductors are coupled to FET 40 such that the source terminal is grounded.

Figure 3A:
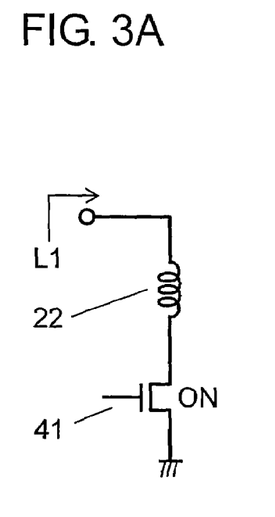
FIG. 3A shows a circuit diagram in which an FET is coupled in series to an inductor in accordance with the first embodiment.
Figure 3B:
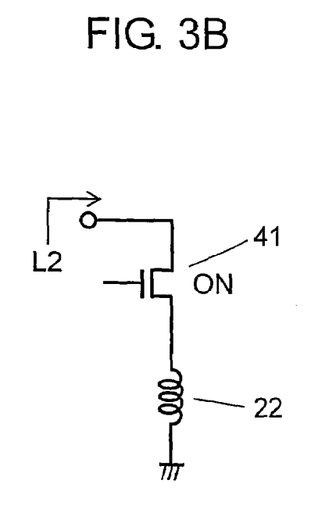
FIG. 3B shows a circuit diagram in which an FET is coupled in series to an inductor in accordance with the first embodiment.
Figure 3C:
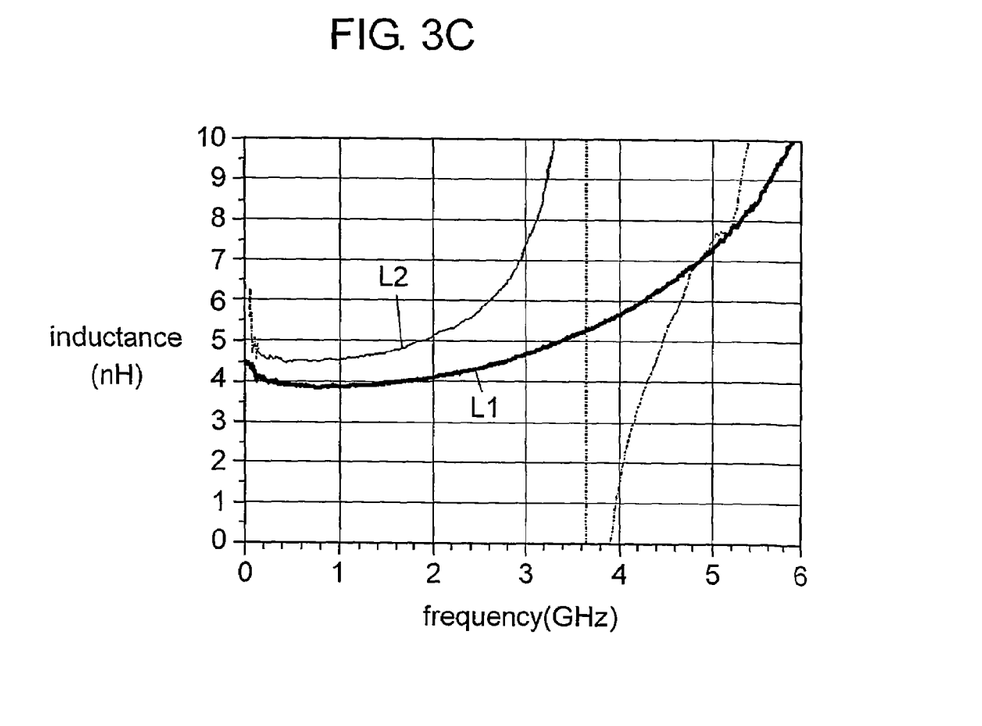
FIG. 3C shows frequency characteristics of an inductance value of the circuit in which the FET is coupled in series to the inductor in accordance with the first embodiment.

FIG. 3C shows an analysis of an inductance value of the circuit in which the FET is coupled in series to the inductor. FIG. 3A shows a circuit in which the source terminal of FET 41 is grounded and the drain terminal is coupled to inductor 22. FIG. 3B shows the circuit where the connection order is switched from what is shown in FIG. 3A, namely, the source terminal of FET 41 is coupled to inductor 22. When the FET is closed, the frequency characteristics are measured for both of the foregoing circuits, and the result is shown in FIG. 3C, where inductor 22 takes a value of approx. 4 nH. The impedance of the circuit shown in FIG. 3A, where the source terminal of the FET is grounded, works inductively up to a high frequency area; however, the circuit shown in FIG. 3B resonates in 3 GHz band, so that it works inductively in a narrower frequency range.

This useless resonance is generated by parasitic reactance component, which adversely affects the performance such as narrowing an inductive frequency range or resisting the adjustment of an inductance value. However, grounding the terminal of the FET can weaken the adverse effect of the parasitic reactance component, so that the useless resonance can be eliminated.

Figure 4A:
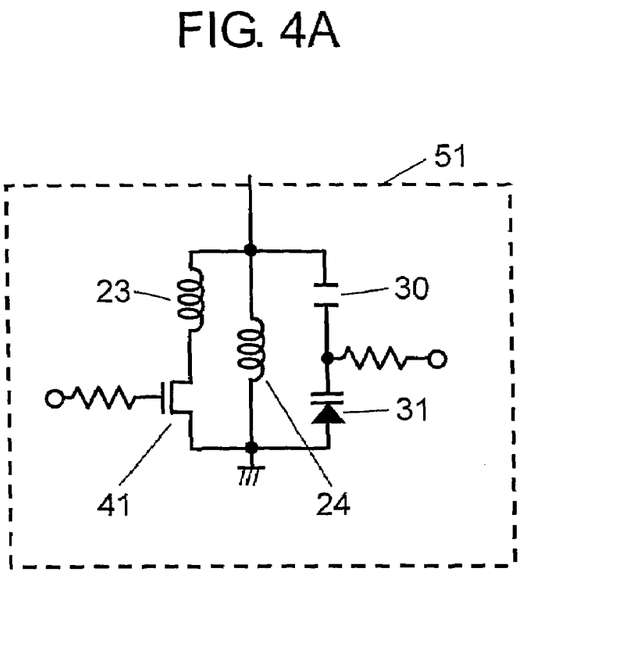
FIG. 4A shows a structure of variable inductance section of a variable matching circuit in accordance with the first embodiment.
Figure 4B:
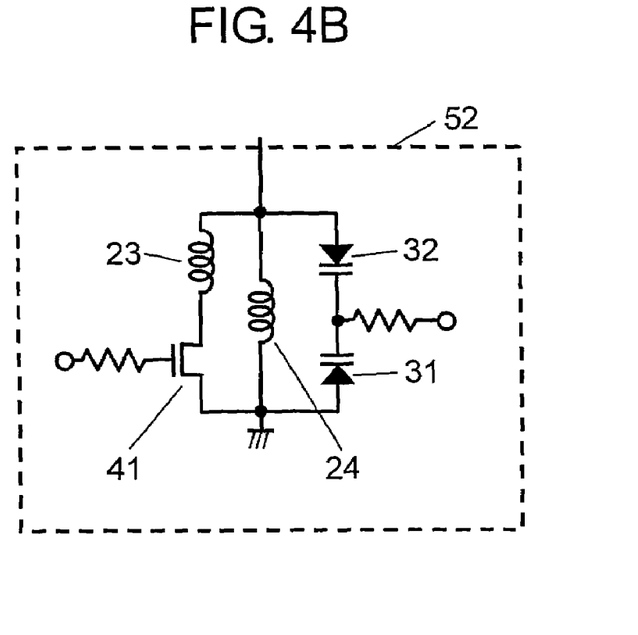
FIG. 4B shows a structure of variable inductance section of a variable matching circuit in accordance with the first embodiment.

FIGS. 4A and 4B show other structures of the resonator-type circuit which works as an inductance element. FIG. 4A shows a circuit formed of inductor 24 coupled in parallel to inductor 23 coupled in series to FET 41 having a source terminal grounded. In resonator-type circuit 51 shown in FIG. 4A, closing of FET 41 will add inductor 23 to inductor 24 in parallel, so that the entire inductance component changes to a smaller one. The number of inductors shorted and grounded is thus varied by opening/closing of the switch, and the element value of the inductance circuit as a whole can be changed step by step.

Resonator-type circuit 52 shown in FIG. 4B has varactor diode 32 instead of capacitor 30 of resonator-type circuit 51 shown in FIG. 4A, and the cathode terminals of varactor diodes 31, 32 are coupled together. The anode terminal of varactor diode 32 is grounded via inductor 24. The bias voltage is controlled at a point on the cathode terminal common to both the varactor diodes, thereby changing the capacitance of both the varactor diodes simultaneously. The circuit shown in FIG. 4A is replaced its capacitor with varactor diode 32, thereby forming the circuit shown in FIG. 4B. In a similar manner, resonator-type circuit 50 shown in FIG. 2A can be replaced its capacitor 30 with a varactor diode. Both of the foregoing structures work as resonator-type circuit 50 demonstrated previously, and can function as a variable inductance element.

As discussed above, variable matching circuit 100 shown in FIG. 1 is a two-terminal circuit, i.e. terminals 70, 71 work as input/output terminals, and it works as an L-type matching circuit which is formed of a capacitance circuit having a variable capacitance as well as a resonator-type circuit having a variable inductance value. The capacitance circuit is coupled between terminals 70 and 71, and the capacitance circuit is grounded via terminal 71.

Figure 5A:
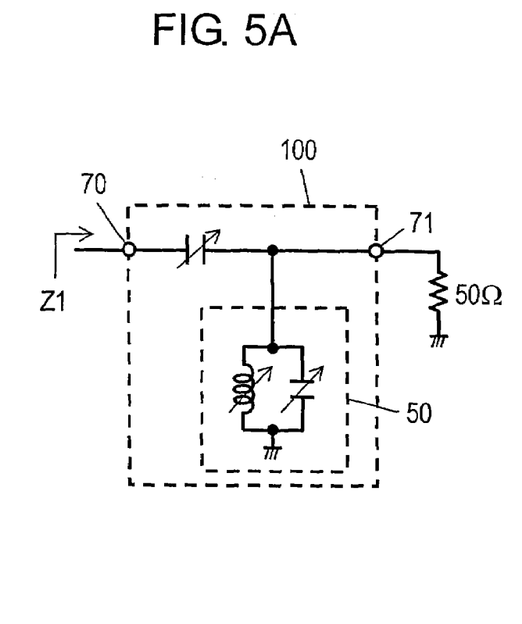
FIG. 5A shows a structure of a variable matching circuit in accordance with the first embodiment.
Figure 5B:
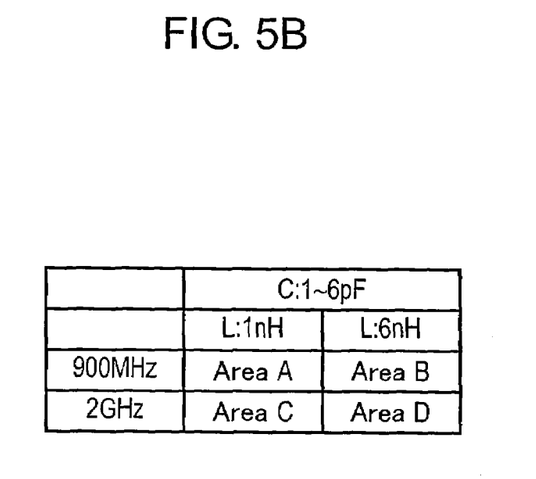
FIG. 5B shows relations between an impedance area variable by the variable matching circuit in accordance with the first embodiment and an inductor component in a resonator-type circuit.
Figure 5C:
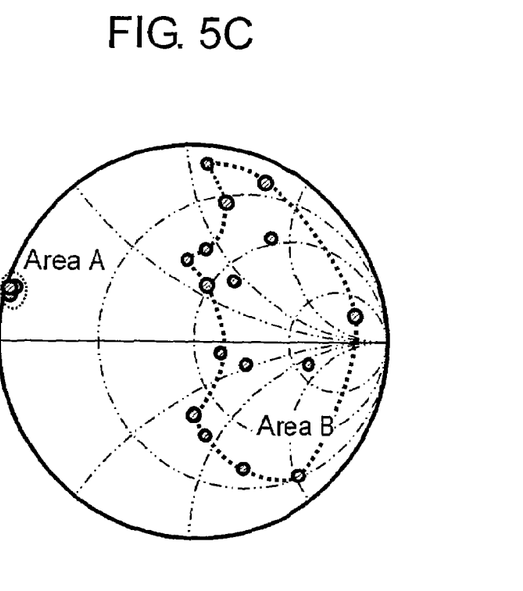
FIG. 5C shows a Smith chart illustrating an impedance conversion by the variable matching circuit in accordance with the first embodiment.
Figure 5D:
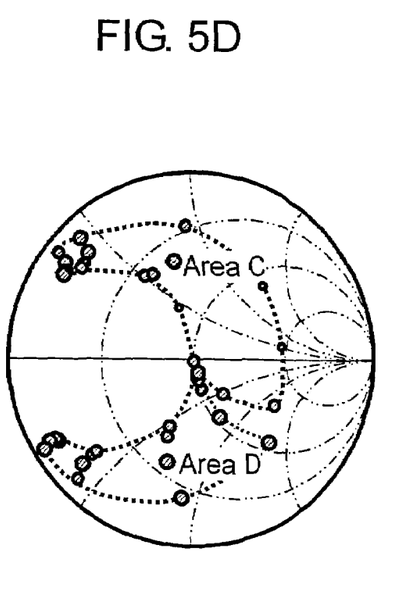
FIG. 5D shows a Smith chart illustrating an impedance conversion by the variable matching circuit in accordance with the first embodiment.

An operation of this variable matching circuit 100 is demonstrated hereinafter with reference to FIG. 5A-FIG. 5D. FIG. 5A shows a structure of a variable matching circuit in accordance with the first embodiment. FIG. 5C and FIG. 5D show the way how variable matching circuit 100 converts an impedance viewed from terminal 70 in the condition of coupling the resistor of 50Ω to terminal 71. The conversion is shown on the Smith chart normalized at 50Ω. The circuit shown in FIG. 5A is a schematic one for a simple description. The actual circuit has a similar structure to the one shown in FIG. 1.

Assume that the capacitance circuit in variable matching circuit 100 varies its capacitance from 1 pF to 6 pF, and the inductance component formed of an inductor and a switch in circuit 100 can be switched over between 2 values, namely, 1 nH and 6 nH. The capacitance component in resonator-type circuit 50 can vary its capacitance from 1 pF to 6 pF independent of the foregoing capacitance circuit. FIG. 5C shows the Smith chart illustrating an area where the impedance is converted at 900 MHz, and FIG. 5D shows the Smith chart illustrating an area where the impedance is converted at 2 GHz. FIG. 5B shows relations between the impedance conversion area shown on the Smith chart and the inductance component in resonator-type circuit 50.

FIG. 5C showing the impedance conversion area at 900 MHz tells that the impedance can be converted in wider area "B" by varying the capacitance circuit at 6 nH of inductance component. When the impedance component is set at 1 nH, it is equivalent to add a low impedance element of approx. 6Ω between terminal 71 and the grounding, so that the impedance conversion area becomes a low impedance as shown with area "A", and the variation width becomes smaller. FIG. 5D showing the impedance conversion area at 2 GHz tells that when the inductance component is set at 1 nH, the impedance having undergone the conversion can be fallen within area "C", i.e. inductive area. When the inductance component is set at 6 nH, the impedance can be converted into a capacitive area shown with area "D". If the inductance component cannot be switched over but it is fixed at 6 nH, the impedance can be converted into only a capacitive impedance at a higher band, i.e. 2 GHz. If the inductance component is fixed at 1 nH, the impedance area convertible at 900 MHz is limited to area "A".

As described in this embodiment, it can be concluded that the resonator-type circuit, which works as a variable inductance element, having a switchable inductance component can be used as an impedance converter available for a wide range of frequency bandwidths.

As discussed above, the variable matching circuit in accordance with this first embodiment comprises the following elements:

a resonator-type circuit formed of an inductance circuit, of which inductance value can be switched over by an FET switch, and a variable capacitance circuit comprising a varactor diode, both the circuits being coupled in parallel to each other; and a capacitance circuit comprising a varactor diode coupled between two terminals of the variable matching circuit.

The resonator-type circuit is grounded via one of the two terminals, so that the variable matching circuit forms an L-type matching circuit. The impedance of the resonator-type circuit is varied sequentially and significantly through capacitance variation of the capacitance circuit as well as inductance value variation of the inductance circuit, and yet, the capacitance circuit, of which capacitance is variable, coupled between the two terminals is combined with the resonator-type circuit, whereby the variable matching circuit that can convert the impedance in a wider range of frequency bandwidths is obtainable.

The variable matching circuit in accordance with this first embodiment includes the inductance circuit which can switch over a plurality of element values, and an end of the switch of the inductance circuit is grounded, so that the adverse affect of parasitic elements existing in the elements such as an FET or diodes forming the switch can be weakened.

FIG. 1 shows an instance where variable matching circuit 100 is used for adjusting the matching between antenna 300 and low-noise amplifier 400; however, circuit 100 is not limited to this application only.

This first embodiment shows an instance where the switch formed of FET 40 is used for varying the inductance value step by step; however, an electrically openable/closable device such as a switching diode can be used instead of the FET.

Resonator-type circuit 50 used in this embodiment shows an instance where one piece of switch and two pieces of inductors are used for building an inductance circuit; however, a greater number of switches and inductors can be used for building an inductance circuit which can switch over three or more than three inductance values.

Embodiment 2

Figure 6:
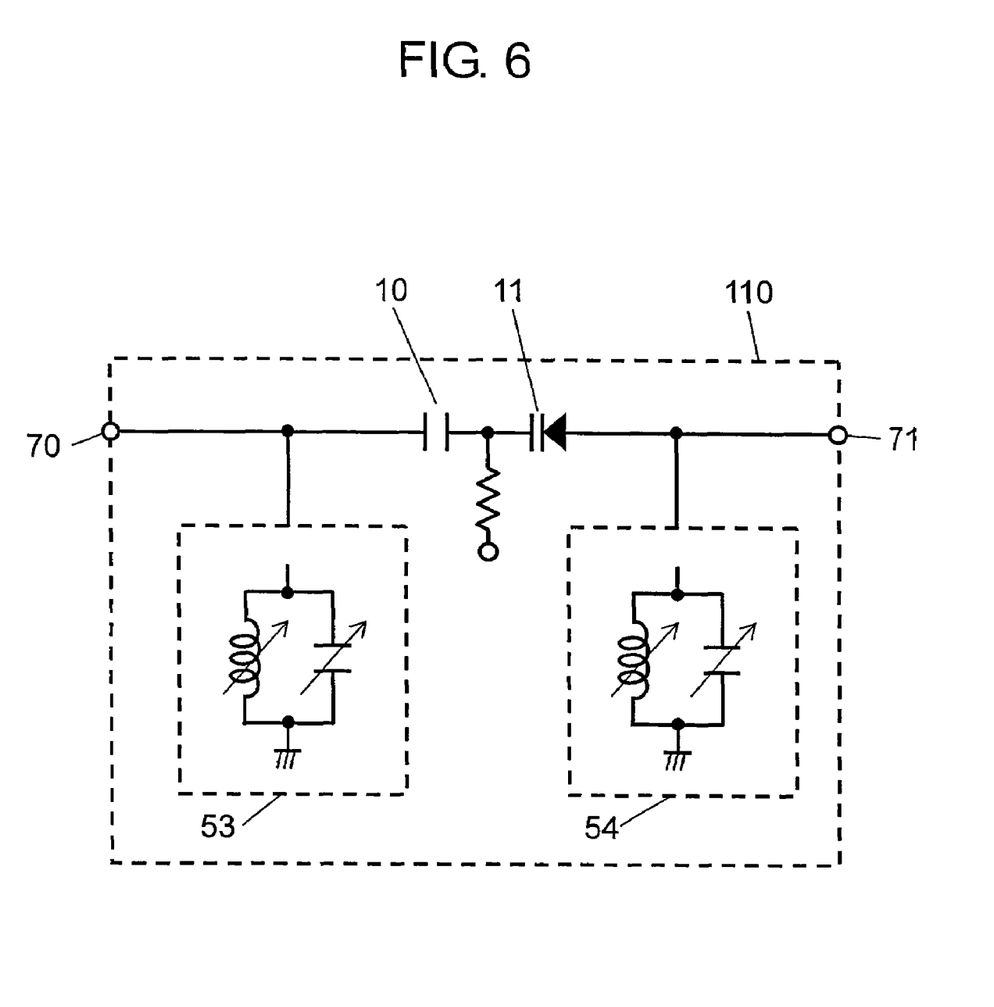
FIG. 6 shows a structure of a variable matching circuit in accordance with a second embodiment of the present invention.

FIG. 6 shows a structure of a variable matching circuit in accordance with the second embodiment of the present invention. This structure differs from that shown in FIG. 1 in providing terminals 70 and 71 with first resonator-type circuit 53 and second resonator-type circuit 54 of the present invention respectively. Resonator-type circuits 53 and 54 are schematically shown in FIG. 6 for simple description; however, the actual circuits are similar to resonator-type circuit 50 shown in FIG. 2A and resonator-type circuit 51 or 52 shown in FIG. 4A or FIG. 4B. An operation of circuits 53 and 54 is demonstrated hereinafter, although their basic operation is similar to that described in the first embodiment.

In FIG. 6, an L-type matching circuit, formed of a seriesly coupled capacitor and a shunt inductor, converts an impedance within a limited range. In this second embodiment, the resonator-type circuits of the present invention are thus provided to both of the input and output terminals, which resonator-type circuits work as variable inductance elements, so that an impedance conversion in wider ranges of frequency bands is achievable.

Let us think about the case where an impedance provided to terminal 71 is converted to a desirable impedance at terminal 70. The impedance provided to terminal 71 has a positive resistance. In this case, assume that no limit exists to the variable range of element value, then use of the seriesly coupled capacitor and the shunt inductor of either one of resonator-type circuit 53 or 54, in other words, use of the third capacitance circuit of the present invention formed of capacitor 10 and varactor diode 11, allows converting an impedance, in theory, into any impedance having a positive resistance component. Determination of the impedance before and after the conversion makes either one of resonator-type circuit 53 or 54 redundant. The affect of the redundant resonator-type circuit to the impedance conversion is desirably to be minimized as much as possible, because the simultaneous control over both of the resonator-type circuits causes the following possible problems: an increase of parameters causes a complicated structure, the redundant resonator-type circuit changes the direction of impedance variation from the targeted one. To minimize the foregoing adverse affects, when the impedance is converted to a desirable one, variable matching circuit 110 of the present invention adjusts a redundant resonator-type circuit, whichever resonator-type circuit 53 or 54 both provided to terminals 70 and 71 is, to be parallel-resonant at the frequency in use. Since the resonator-type circuit forms an LC parallel-resonant circuit, it is easy to control the resonator-type circuit to be parallel-resonant at the frequency in use by varying the capacitance value sequentially. The impedance of the resonator-type circuit at the parallel-resonance becomes extremely high, so that the impedance conversion of the resonator-type circuit is less affected.

An operation of variable matching circuit 110 in the instance where terminal 71 is coupled with 50Ω resistance and the impedance conversion viewed from terminal 70 is demonstrated hereinafter.

Assume that the capacitance circuit in variable matching circuit 110 varies its capacitance from 1 pF to 6 pF under a similar condition to that of the variable matching circuit described with reference to FIGS. 5C and 5D in the first embodiment, and the inductance component formed of inductors and a switch in resonator-type circuits 53 and 54 is switched over in two values, i.e. 1 nH and 6 nH.

The capacitance components in resonator-type circuits 53 and 54 can vary from 1 pF to 6 pF independently of each other. Then an parallel-resonance of resonator-type circuit 53 at the frequency in use makes the circuit identical to the circuit shown in FIG. 6A, so that the impedance conversion area at 900 MHz and 2 GHz becomes what are shown in FIGS. 5C and 5D. On the other hand, an parallel-resonance of resonator-type circuit 54 at the frequency in use results in what are shown in FIG. 7A-FIG. 7E.

Figure 7A:
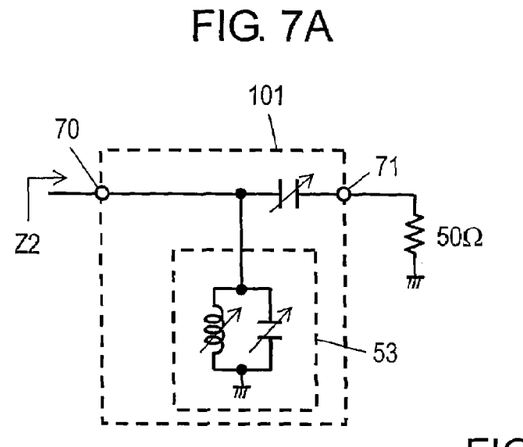
FIG. 7A shows another structure of a variable matching circuit in accordance with the second embodiment of the present invention.
Figure 7B:
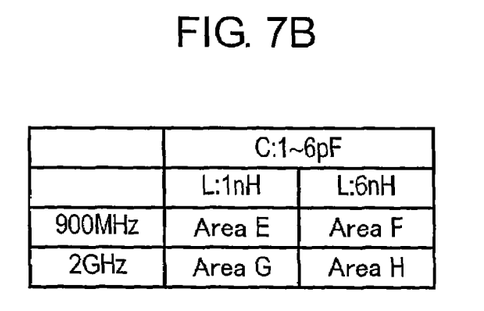
FIG. 7B shows relations between an impedance area variable by the variable matching circuit in accordance with the second embodiment and an inductor component in a resonator-type circuit.
Figure 7C:
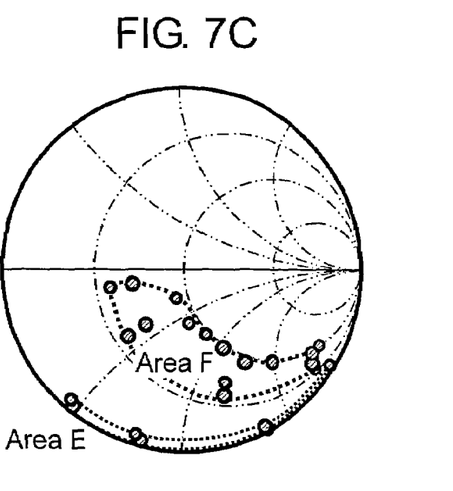
FIG. 7C shows a Smith chart illustrating an impedance conversion by the variable matching circuit in accordance with the second embodiment.
Figure 7D:
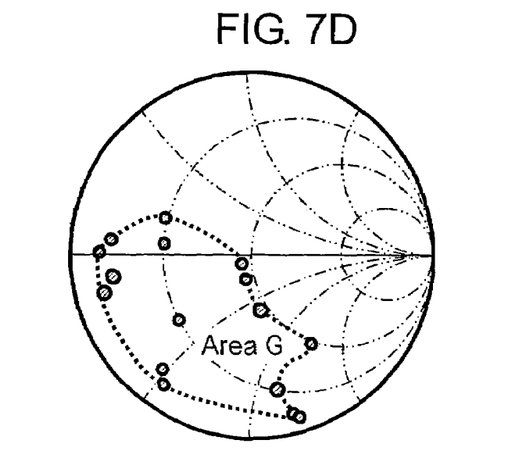
FIG. 7D shows a Smith chart illustrating an impedance conversion by the variable matching circuit in accordance with the second embodiment.
Figure 7E:
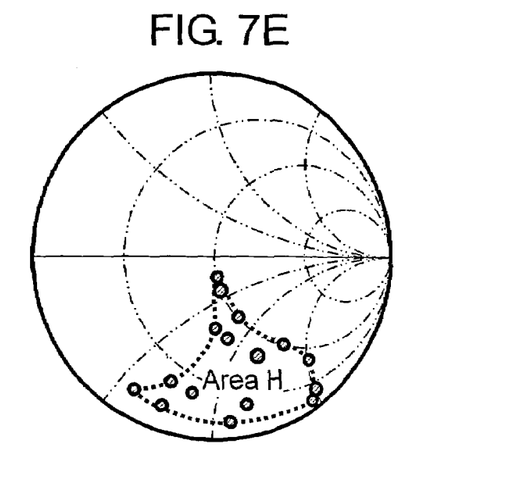
FIG. 7E shows a Smith chart illustrating an impedance conversion by the variable matching circuit in accordance with the second embodiment.

FIG. 7A shows a circuit equivalent to resonator-type circuit 54 of variable matching circuit 110 in parallel-resonant operation. FIG. 7C shows an area where the impedance can be converted at 900 MHz, FIGS. 7D and 7E show areas where the impedance can be converted at 2 GHz. FIG. 7B shows relations between impedance convertible area shown on the Smith chart and the inductor values in resonator-type circuit 53.

The circuit shown in FIG. 5A and equivalent to parallel-resonating resonator-type circuit 53 can convert the impedance into the one having a resistance value generally greater than 50Ω while the circuit shown in FIG. 7A and equivalent to parallel-resonating resonator-type circuit 54 can convert the impedance into the one having a resistance value generally smaller than 50Ω. The resonator-type circuit to be parallel-resonant is selected in response to the resistance value of the impedance to be converted, and the other resonator-type circuit as well as the variable capacitance circuit is adjusted, whereby a desirable conversion is achievable.

As discussed above, the second embodiment proves that a variable matching circuit having the following structure allows an impedance conversion available for wider ranges of frequency bandwidths: The variable matching circuit comprises the following elements:

two resonator-type circuits each of which circuits is formed of an inductance circuit, of which inductance value can be switched over by an FET switch, and a variable capacitance circuit comprising a varactor diode, both of the inductance circuit and the variable capacitance circuit being coupled in parallel to each other; and a capacitance circuit comprising a varactor diode coupled between the two terminals of the variable matching circuit.

The resonator-type circuits are grounded via both of the terminals, whereby a π-shaped matching circuit is constructed.

Parallel-resonating either one of the two resonator-type circuits at the frequency in use allows weakening the adverse affect from the parallel-resonating resonator-type circuit to the impedance conversion, so that a desirable impedance conversion can be obtained through simple adjustment of the variable matching circuit.

The resonator-type circuits are grounded in parallel, and the impedance of parallel-resonating resonator-type circuit is extremely high. For instance, at an impedance conversion, if one of the two resonator-type circuits coupled in parallel varies in a different direction from a desirable impedance variation, the foregoing structure allows weakening the adverse affect from this resonator-type circuit to the impedance conversion and controlling the desirable impedance conversion with ease.

The variable matching circuit in accordance with the second embodiment includes the inductance circuit which can switch over a plurality of element values, and an end of the switch of the inductance circuit is grounded, so that the adverse affect of parasitic elements, existing in the elements such as an FET or diodes forming the switch, can be weakened.

In this second embodiment, one of the two resonator-type circuits parallel-resonates at the frequency in use; however, the two resonator-type circuits can be simultaneously controlled for impedance conversion. Both of the two resonator-type circuits parallel-resonate, so that the impedance can be converted with only the seriesly coupled capacitor.

Embodiment 3

Figure 8A:
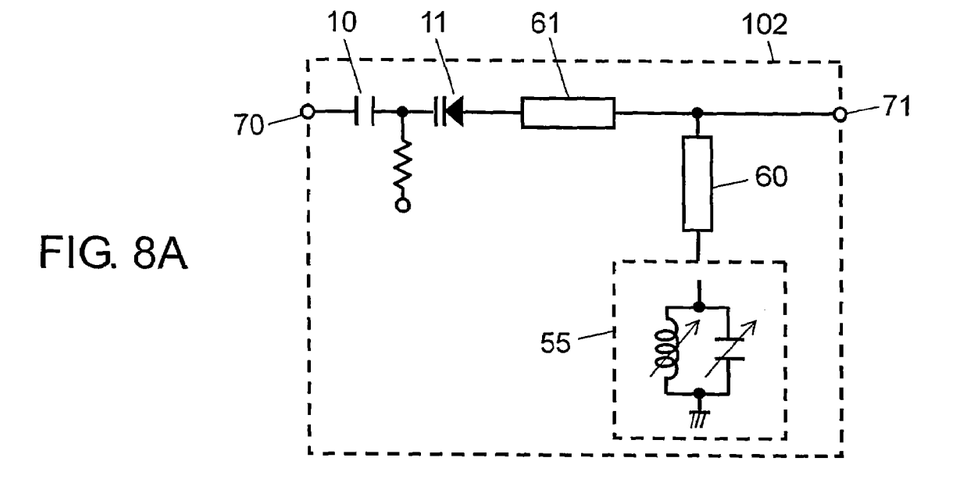
FIG. 8A shows a structure of a variable matching circuit in accordance with a third embodiment of the present invention.

FIG. 8A shows a structure of a variable matching circuit in accordance with the third embodiment. This structure differs from the one shown in FIG. 1 in providing distributed constant line 60 between terminal 71 and resonator-type circuit 55 as well as distributed constant line 61 between terminal 71 and varactor diode 11. Resonator-type circuit 55 shown in FIG. 8A is schematically illustrated for a simple description, but its actual structure is similar to resonator-type circuit 50 shown in FIG. 2A, resonator-type circuit 51 shown in FIG. 4A, or resonator-type circuit 52 shown in FIG. 4B. Resonator-type circuit 55 basically works similarly to the variable matching circuit demonstrated in the first embodiment.

The variable matching circuit includes the capacitance circuit employing varactor diode 11 and corresponding to the second capacitance circuit of the present invention, so that the capacitance can be varied sequentially. The components to be actually used such as a varactor diode or a chip-capacitor have parasitic reactance component, which sometimes causes the capacitance circuit to self-resonate. The variable capacitance circuit formed of capacitor 10 and varactor diode 11 coupled in series to each other thus generates series resonance with 0 (zero) impedance due to the self-resonance at a high frequency bandwidth, and yet, sometimes only a low impedance is obtainable even at the higher frequency. This third embodiment thus provides distributed constant lines 60 and 61 to the capacitance circuit, so that impedance conversion can be done around the self-resonant frequency of the capacitance circuit or at the higher frequency band than the self-resonant frequency.

Figure 8B:
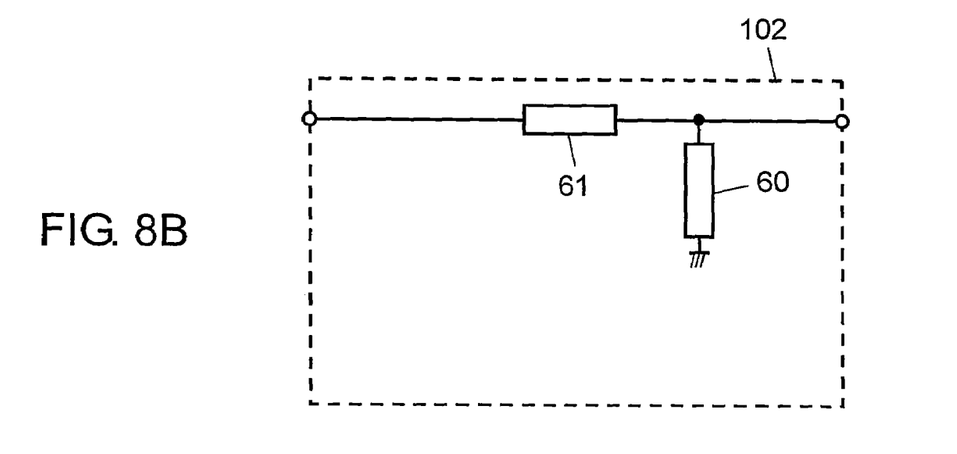
FIG. 8B shows a structure of a variable matching circuit in accordance with the third embodiment of the present invention.

When the capacitance circuit series-resonates, variable matching circuit 102 shown in FIG. 8A becomes equivalent to the circuit shown in FIG. 8B, so that a desirable impedance conversion can be achieved around the self-resonant frequency of the capacitance circuit or at the higher frequencies than the self-resonant frequency by using distributed constant lines 60, 61.

An effective electrical length of the distributed constant line to the impedance conversion is up to approx. 90 degrees, and the line affects only a little to the conversion at a low frequency free from the affect by the self-resonance of the capacitance circuit. This reactance component should be considered for designing the variable matching circuit; however, this variable matching circuit can work similarly to the one described in the first embodiment.

Variable matching circuit 102 includes the distributed constant circuit shown in FIG. 8B, and this distributed constant circuit cannot obtain a varying function at a high frequency band, so that an impedance is converted to a fixed value only; however, at a lower frequency band, the impedance conversion can be varied and adjusted as previously discussed.

Figure 8C:
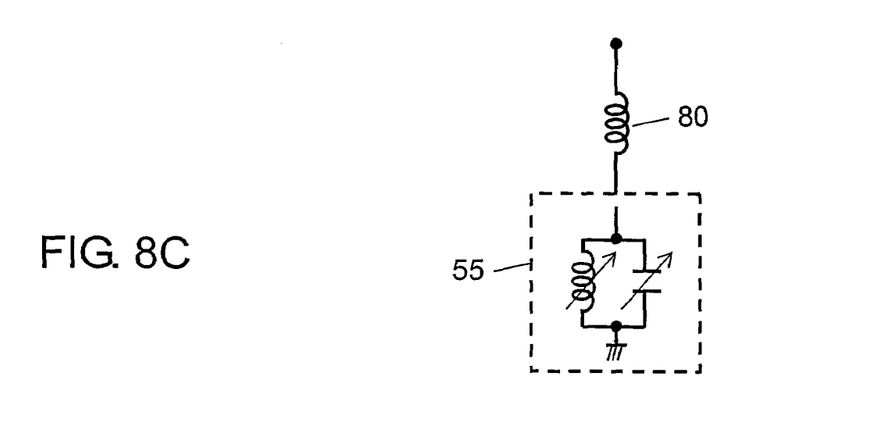
FIG. 8C shows a structure of a distributed constant line and a resonator-type circuit in accordance with the third embodiment.

Distributed constant line 60 looks like a grounding stub; however, when its electric length is smaller than 90 degrees, it is equivalent to an inductor, so that distributed constant line 60 and resonator-type circuit 55 can be replaced with the structure shown in FIG. 8C where resonator-type circuit 55 is coupled with inductor 80 having a rather small value.

As discussed above, the third embodiment proves that when variable capacitance circuit generates self-resonance, the variable matching circuit allows the impedance to be converted with the distributed constant line around the self-resonating frequency or a higher frequency band than the self-resonating frequency. At the lower frequency band, the variable matching circuit allows the impedance conversion in wider ranges of frequency bands.

The variable matching circuit in accordance with the third embodiment allows the distributed constant line to convert a low impedance to an appropriate reactance value for carrying out a desirable impedance conversion even if the impedance of the resonator-type circuits coupled in parallel together becomes smaller due to the adverse affect of self-resonance of elements forming the resonator-type circuits. This function works effectively at a high frequency band among others.

In this third embodiment, two distributed constant lines are provided; however, if a desirable impedance conversion can be carried out, either one of the lines can be omitted. Distributed constant line 61 is provided to terminal 71; however, it can be provided to terminal 70. The resonator-type circuit is prepared on the side of terminal 71; however, it can be prepared on the side of terminal 70.

The distributed constant circuit can be provided to the π-type matching circuit demonstrated in the second embodiment. In this case, the distributed constant circuit is provided between the capacitance circuit formed of capacitor 10 together varactor diode 11 and resonator-type circuit 53 or 54. This structure can produce a similar advantage to what is discussed above.

INDUSTRIAL APPLICABILITY

A variable matching circuit of the present invention is useful when it is used as a variable matching circuit which electrically adjusts an impedance conversion in wide ranges of frequency bandwidth from UHF band to microwave-band. The present invention is fit to constructing a radio device particularly adaptable to a wireless system using multi-bands or different types of wireless networks requiring a plurality of radio frequency bands. The present invention; however, is not limited to the foregoing applications.

The invention claimed is:
1. A variable matching circuit comprising:
  a resonator-type circuit including:
    an inductance circuit having a first end grounded and a variable inductance value;
    a first capacitance circuit coupled in parallel to the inductance circuit and having a variable capacitance; and
  a second capacitance circuit coupled to a second end of the inductance circuit and having a variable capacitance
  wherein the inductance circuit includes a plurality of inductors coupled in series together and a switch coupled in parallel to at least one of the plurality of inductors.
2. The variable matching circuit of claim 1, wherein a distributed constant line is provided between the resonator-type circuit and the second capacitance circuit.
3. The variable matching circuit of claim 1, wherein a distributed constant line is provided between the resonator-type circuit and the second capacitance circuit.

* * * * *